United States Patent [19]
Myer et al.

[11] Patent Number: 5,745,846
[45] Date of Patent: Apr. 28, 1998

[54] CHANNELIZED APPARATUS FOR EQUALIZING CARRIER POWERS OF MULTICARRIER SIGNAL

[75] Inventors: Robert Evan Myer, Denville; Jack Chi-Chieh Wen, Parsippany, both of N.J.

[73] Assignee: Lucent Technologies, Inc., Murray Hill, N.J.

[21] Appl. No.: 512,003

[22] Filed: Aug. 7, 1995

[51] Int. Cl.$^6$ .................................................. H04B 1/16
[52] U.S. Cl. .................. 455/209; 455/258; 455/303; 330/126
[58] Field of Search ............................ 455/103, 207, 455/208, 209, 234.1, 234.2, 255, 258, 303, 250.1; 330/124 R, 126

[56] References Cited

U.S. PATENT DOCUMENTS

| | | | |
|---|---|---|---|
| 4,509,206 | 4/1985 | Carpe et al. | 455/303 |
| 5,222,106 | 6/1993 | Satoh et al. | 455/209 |
| 5,287,543 | 2/1994 | Wockstein | 455/103 |
| 5,289,464 | 2/1994 | Wang | 370/69.1 |
| 5,300,894 | 4/1994 | Myer et al. | 330/124 R |
| 5,302,914 | 4/1994 | Arntz et al. | 330/129 |
| 5,304,945 | 4/1994 | Myer | 330/149 |
| 5,530,920 | 6/1996 | Takeda | 455/103 |

OTHER PUBLICATIONS

"Microwave Frequency Selective Limiting Filter", GEC-Marconi Research Center Catalog, Nov. 1992.

Primary Examiner—Edward F. Urban

[57] ABSTRACT

Disclosed is a channelized multi-carrier signal processor capable of equalizing power levels of individual carriers of a multi-carrier signal to within a predetermined dynamic range. In one embodiment, the signal processor includes a power splitter for splitting a multi-carrier input signal into a plurality of electrical paths. In each electrical path there resides a signal modifier that is operable to isolate signal energy associated with a given carrier of the multi-carrier signal. Each signal modifier includes an automatic gain control (AGC) circuit to control the power level of the carrier isolated therein to within a predetermined power level window so that the isolated carriers of each signal modifier are equalized in power. A power combiner then combines the equalized carriers to produce a multi-carrier output signal, which can be applied to a limited dynamic range device such as an A/D converter. Preferably, the carriers are isolated with the use of a tunable frequency synthesizer and a down-converting mixer within each signal modifier. This arrangement provides flexibility as to the frequencies which can be used for the modulated carriers of the multi-carrier input signal.

14 Claims, 4 Drawing Sheets

CHANNELIZED APPARATUS FOR EQUALIZING CARRIER POWERS OF MULTICARRIER SIGNAL

FIELD OF THE INVENTION

The present invention relates to signal processing of a modulated, multicarrier signal. More particularly, it relates to a multi-carrier signal processor capable of independently controlling the power level of each carrier of a multi-carrier input signal.

BACKGROUND OF THE INVENTION

In wireless communications systems, modulated radio frequency (RF) signals of multiple communications channels are simultaneously received by a common antenna at a base station, with each channel containing the power of a given modulated carrier. The received multi-carrier, frequency multiplexed signal that results must be processed to extract the signal information associated with the individual channels. Once the individual channels are isolated, the signals therein are typically digitized for subsequent digital signal processing and transmission to a remote location.

A prior art system for receiving and processing the modulated RF signals is depicted in FIG. 1. An antenna 12 receives RF signals S1 to SN which have respective modulated carriers at frequencies f1 to fN. The signals S1 to SN each occupy a specific frequency channel within a frequency band allocated for the multiple channels. The antenna 12 combines the signals into a multi-carrier signal which is filtered by a bandpass filter 14 that has a passband corresponding to the allocated frequency band. A low noise amplifier 16 amplifies the filtered signal which is then applied to a 1:N equal power splitter 18. Each of the N outputs are then frequency translated by a down converter 20 and filtered by a narrow bandpass filter 22. Each filter 22 has a passband corresponding to one of the specific frequency channels, thereby isolating the individual modulated carriers f1 to fN (down-converted). Each isolated carrier signal is then digitized by an analog to digital (A/D) converter 24 dedicated to the corresponding channel, to enable subsequent digital signal processing to occur.

One drawback with the above type of system resides in the use of the multiple A/D converters which significantly adds to the complexity of the system. Indeed, as wireless communications systems become more prevalent, the number of users will rise, thereby fueling the demand for simpler and less costly systems. Accordingly, there is a need to simplify the above described system without adversely impacting system performance.

U.S. Pat. No. 5,694,395 entitled "Method and Apparatus for Processing Multicarrier Signals", is directed to methods and apparatus which alter the dynamic range of a multicarrier signal. Therein, a multicarrier signal processor is disclosed which employs a controller configured to receive at least a portion of a multi-carrier signal, the controller analyzing the signal to identify at least one carrier signal of the multi-carrier signal to be modified. At least one signal modifier isolates a carrier signal to be modified as directed by the controller, and modifies the isolated carrier signal. A signal combiner receives the modified carrier signal and combines it with an unmodified multicarrier signal.

SUMMARY OF THE INVENTION

The present invention is directed to a channelized multi-carrier signal processor capable of equalizing power levels of individual carriers of a multi-carrier signal to within a predetermined dynamic range. In one embodiment, the signal processor includes a power splitter for splitting a multi-carrier input signal into a plurality of electrical paths. In each electrical path there resides a signal modifier that is operable to isolate signal energy associated with a given carrier of the multi-carrier signal. Each signal modifier includes an automatic gain control (AGC) circuit to control the power level of the carrier isolated therein to within a predetermined power level window so that the isolated carriers of all the signal modifiers are equalized in power. A power combiner then combines the equalized carriers to produce a multi-carrier output signal, which can then be applied to a limited dynamic range device such as an A/D converter capable of digitizing a multi-carrier signal.

Preferably, the carriers are isolated with the use of a tunable frequency synthesizer and a down-converting mixer within each signal modifier. This arrangement provides flexibility as to the frequencies which can be used for the modulated carriers of the multi-carrier input signal.

The multi-carrier signal processor is particularly useful as part of a wireless communications receiving system. For this application, a plurality of modulated RF signals, each of an associated frequency channel, are received by an antenna and combined into a multi-carrier, frequency multiplexed input signal. The multi-carrier signal processor equalizes the power levels of RF signals within the multi-carrier input signal and provides a recombined multi-carrier output signal to a single A/D converter for subsequent digital signal processing.

BRIEF DESCRIPTION OF THE FIGURES

For a full understanding of the present invention, reference is had to an exemplary embodiment thereof, considered in conjunction with the accompanying figures in which like reference numerals designate like elements or features, for which.

DETAILED DESCRIPTION OF THE PREFERRED EMBODIMENTS

Figure 1:
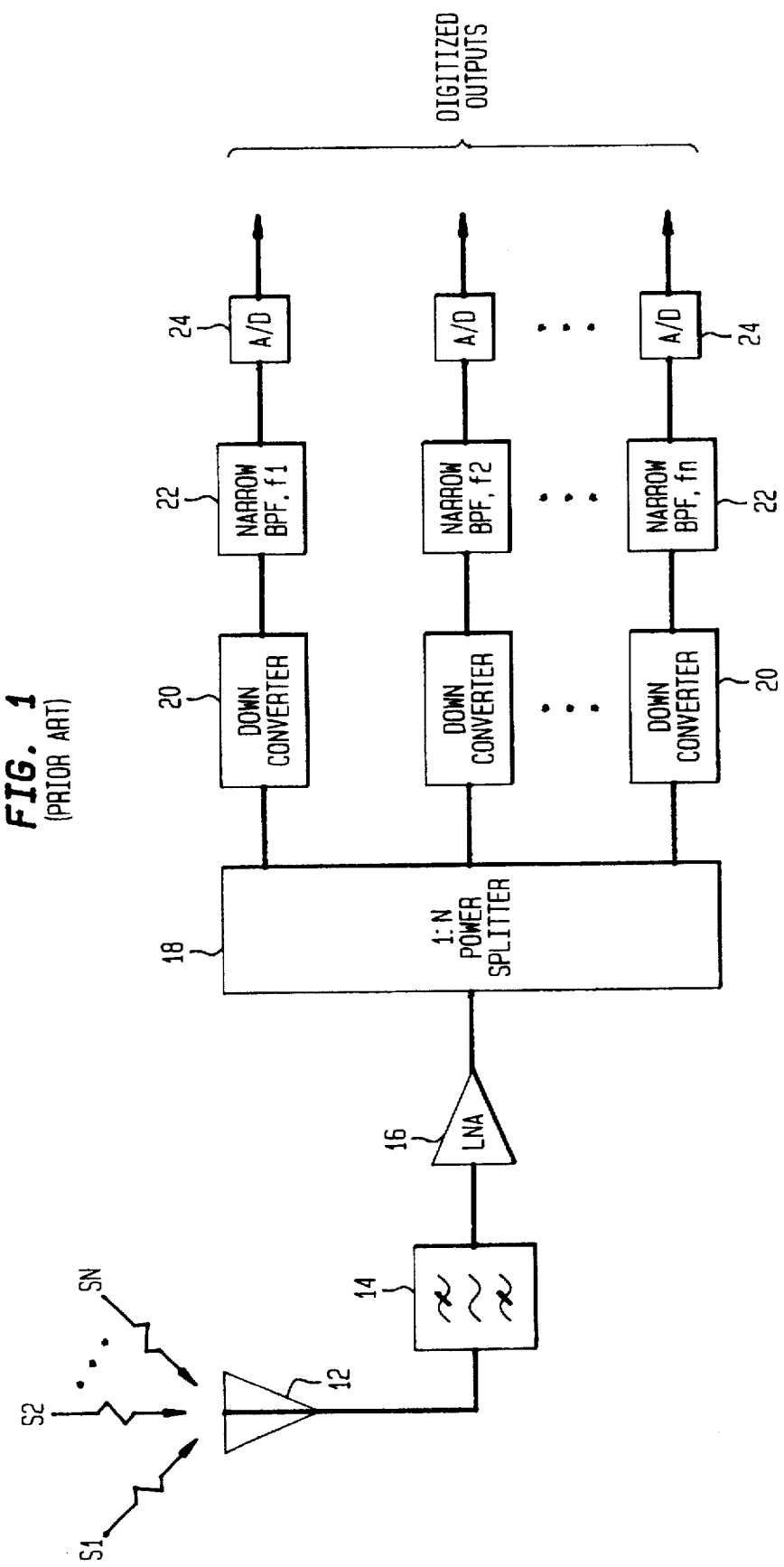
FIG. 1 shows a prior art receiving system.
Figure 2:
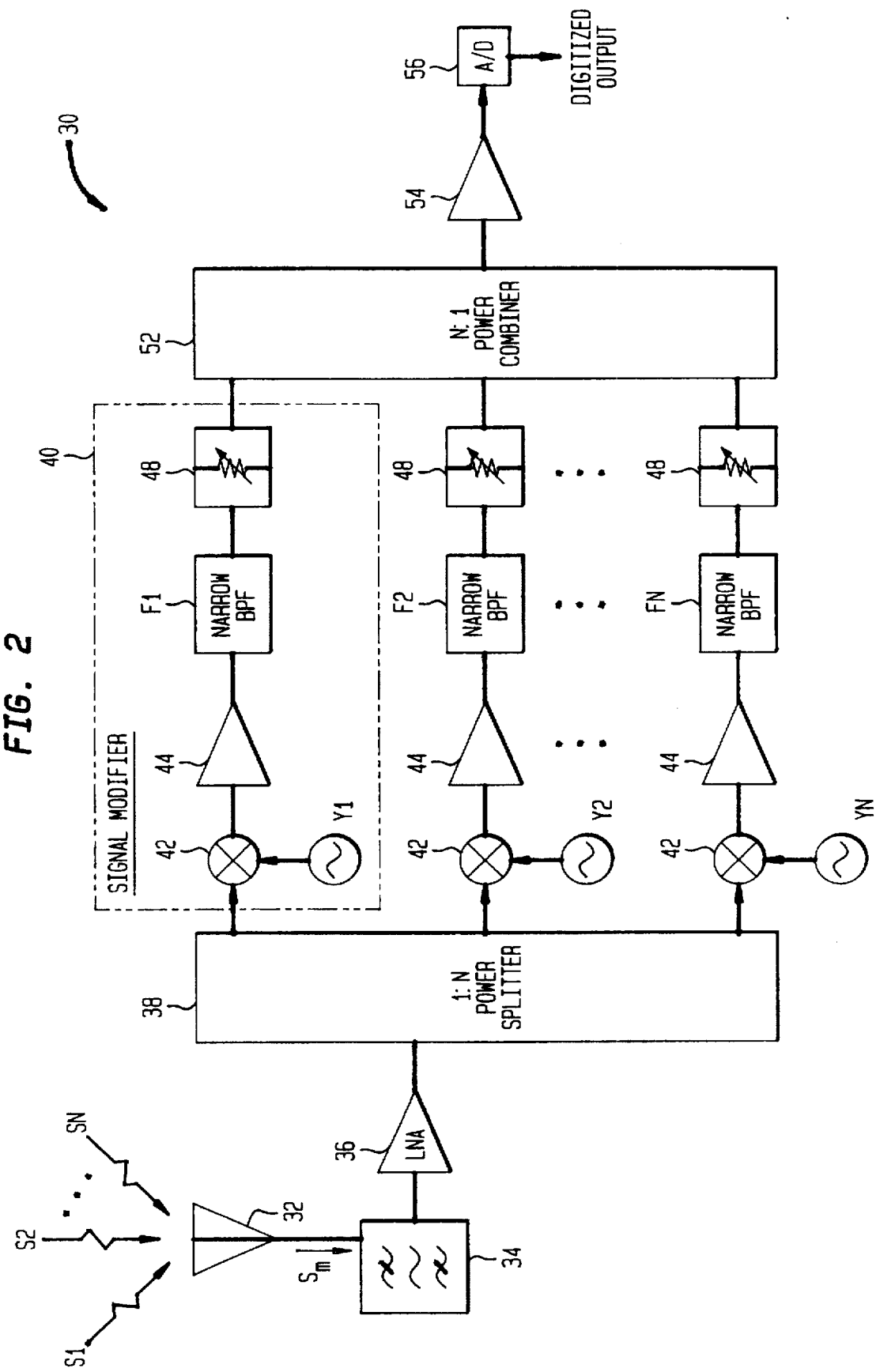
FIGS. 2–4 depict various embodiments of a channelized multi-carrier receiving system of the present invention.

Referring to FIG. 2, there is shown a first embodiment of a channelized multi-carrier receiving system of the present invention, designated generally by the reference numeral 30. The system 30 is operable to receive a plurality of modulated carrier signals S1 to SN, and to control the power level of each signal to within a predetermined range. This power level control allows the signals to be recombined into a multi-carrier output signal which can be applied to a limited dynamic range device such as an A/D converter for further signal conditioning. Consequently, a single A/D converter 56 can be employed to digitize the information within all the signals S1 to SN for subsequent digital signal processing. This feature provides a marked advantage over prior art systems requiring multiple A/D converters. See, e.g. FIG. 1.

The modulated carrier signals S1 to SN, each of which may occupy a different frequency channel within a wider, allocated frequency range, are received by an antenna 32 where they are effectively combined to form a multi-carrier, frequency multiplexed signal Sm. By way of example, each signal S1 to SN may be a UHF signal with a signal bandwidth on the order of 30 KHz. If the allocated frequency band for S1 to SN is 800–803 MHz and N=100, one hundred signals S1 to S100 would be received, each occupying a 30 KHz bandwidth. Thus, the S1 signal would contain a carrier frequency f1 at 800.015 MHz, which when modulated occupies the band from 800.000 to 800.030 MHz; the SN signal would have a carrier frequency fN at 802.985 MHz, and so forth. Each one of the one hundred channels could in turn carry several subchannels in a Time Division Multiple Access (TDMA) format or in a Coded Division Multiple Access (CDMA) format. Modulation schemes which could be employed include digital techniques such as phase shift keying (PSK) or frequency shift keying (FSK), or analog modulation such as frequency modulation (FM). In any case, the power levels of each of the signals S1 to SN may differ widely by the time they reach the antenna 32, as, for example, in mobile telephone applications where each signal originates from a mobile user at a different location. These power variations are substantially compensated for by the receiving system 30 which equalizes the received power levels of each modulated carrier to enable efficient digital signal processing to follow.

The multi-carrier signal Sm provided by the antenna 32, is filtered by a bandpass filter 34 which has a passband corresponding substantially to the allocated frequency range for S1 to SN—e.g., a 3 MHz band in the above example. Preferably, the filtered Sm signal is amplified by a low noise amplifier (LNA) 36 to enhance noise figure performance of the circuitry to follow. Next, the amplified Sm signal is split into N electrical paths by a 1:N power splitter 38, with the attenuated Sm signal in each one of the N paths applied to a signal modifier circuit 40. If the multi-carrier Sm signal is at UHF or higher frequencies, the power splitter 38 is preferably of the distributed type, manufactured in microstrip or stripline. The power dividing elements could in this case be Wilkinson dividers, or hybrid type dividers such as branch line or rat race couplers, all of which are well known in the art. At lower frequencies, a lumped element, resistive type power splitter could be used.

Each signal modifier 40 operates to modify the power level of a particular modulated carrier signal S1 to SN. The modulated carriers are isolated by means of narrow bandpass filters F1 to FN, which have respective resonant frequencies corresponding to the carriers f1 to fn (down-converted) of the S1 to SN signals, respectively. At the input of each signal modifier 40 is a down-converting mixer 42 which mixes the multi-carrier signal Sm with a local oscillating signal generated by an associated one of N tunable frequency synthesizers Y1 to YN. Each synthesizer Y1 to YN provides an independently tunable local oscillator (L.O.) frequency to afford a wide degree of flexibility as to which carrier frequencies can be subsequently isolated and modified. Tunable frequency synthesizers suitable for Y1 to YN are well known in the art and are widely available commercially as programmable devices. Typically, such frequency synthesizers utilize a voltage controlled oscillator (VCO) in conjunction with a phase locked loop to provide a highly stable L.O. frequency.

The down-converted, intermediate frequency (IF) output of the mixer 42 is a multi-carrier, frequency multiplexed signal which may be in the range of 50–100 MHz. This IF signal is amplified by an IF amplifier 44 and filtered by one of the narrow bandpass filters F1 to FN. With the bandpass filters F1 to FN designed to resonate at IF frequencies associated with the carriers f1 to fN, respectively, each bandpass filter F1 to FN isolates the down-converted signal energy of a particular input signal S1 to SN. Thus each narrowband filter as F1 has a passband corresponding substantially to the signal bandwidth of the modulated carrier signal as S1 that it is isolating. In the above example in which each signal S1 to SN occupies a 30 KHz signal bandwidth, each narrowband filter could have a 30 KHz IF passband to capture the corresponding RF energy. Of course, if the S1 to SN signals occupy non-contiguous frequency bands, with negligible signal energy in frequency zones between the non-contiguous bands, then each of the filters F1 to FN could have wider passbands.

If the respective carriers f1 to fN of the S1 to SN signals are uniformly spaced in frequency over the allocated frequency range for S1 to SN, then the synthesizers Y1 to YN could all be tuned to the same L.O. frequency. In this case, the filtered IF carriers within the signal modifiers 40 would be uniformly spaced in frequency with respect to one another—that is, the entire spectrum of S1 to SN (a 3 MHz span in the above example) would be uniformly translated to a lower IF frequency range (e.g., a 3 MHz span within an IF band of 50–100 MHz). For example, if the S1 to SN signals collectively occupy the band of 800–803 MHz with 30 KHz spacing between carriers, and each signal modifier 40 uses an L.O. frequency of 750 MHz, then the IF output of each mixer 42 would range from 50–53 MHz. Then, with the resonant frequency of filter F1 at 50.015 MHz; of filter F2 at 50.045 MHz; and of filter FN at 52.985 MHz and so on, the signal modifiers 40 have uniform filtered IF carrier spacings of 30 KHz therebetween. If, however, it is desired to maintain this uniform filtered IF carrier spacing between signal modifiers even though the signals S1 to SN are non-uniformly spaced, as is the case in a variety of applications, then at least some of the synthesizers Y1 to YN would need to be tuned to different L.O. frequencies from one another.

Following each narrow bandpass filter within each signal modifier 40, is an automatic gain control (AGC) circuit 48 that functions to provide automatic power level control of the filtered IF signals. The filtered IF is thereby controlled to within a predetermined power level range or window. Preferably, the same power level window is used for each signal modifier 40 to thereby equalize the filtered IF carriers to within a predefined range. The AGC circuit 48 may provide variable amplification only, variable attenuation only, or a combination of variable gain and attenuation. AGC circuits that operate at IF frequencies on the order of 50–100 Mhz, for example, are well known and are widely available commercially from multiple manufacturers.

The filtered, level controlled IF output signals of the AGC circuits 48 are applied to an N:1 power combiner 52 where they are combined into a multi-carrier output signal that appears at the input of an IF amplifier 54. The power combiner 52, designed for IF frequencies on the order of 50–100 MHz in the exemplary case, is of the lumped element type. Since the filtered IF carriers of the individual signal modifiers 40 are each at a different frequency, each will be attenuated in the power combiner 68, thereby necessitating further amplification—hence the need for the amplifier 54. The amplifier 54 output is then supplied to a limited dynamic range device, which is the A/D converter 56 in the exemplary embodiment. A/D converters as 56 that are capable of digitizing multi-carrier signals can typically perform properly only over a limited dynamic range of the individual carrier powers. Accordingly, the technique of independent control of carrier power levels of the present invention, enables a single A/D converter 56 to replace the multiple A/D converters used in the prior art multi-carrier receiving systems.

The digitized output of the A/D converter 56 may be processed by the use of a filter bank analyzer capable of exponentially modulating the digitized signal, then low pass filtering and decimating the signal to yield N complex signals, each corresponding to one of the S1 to SN signals. These complex signals would then be demodulated for further processing. A digital signal processing system of this type is disclosed in U.S. Pat. No. 5,289,464 entitled "Frequency-Multiplexed Cellular Telephone Cell Site Base Station and Method of Operating the Same", to R. Wang and assigned to the assignee herein.

Figure 3:
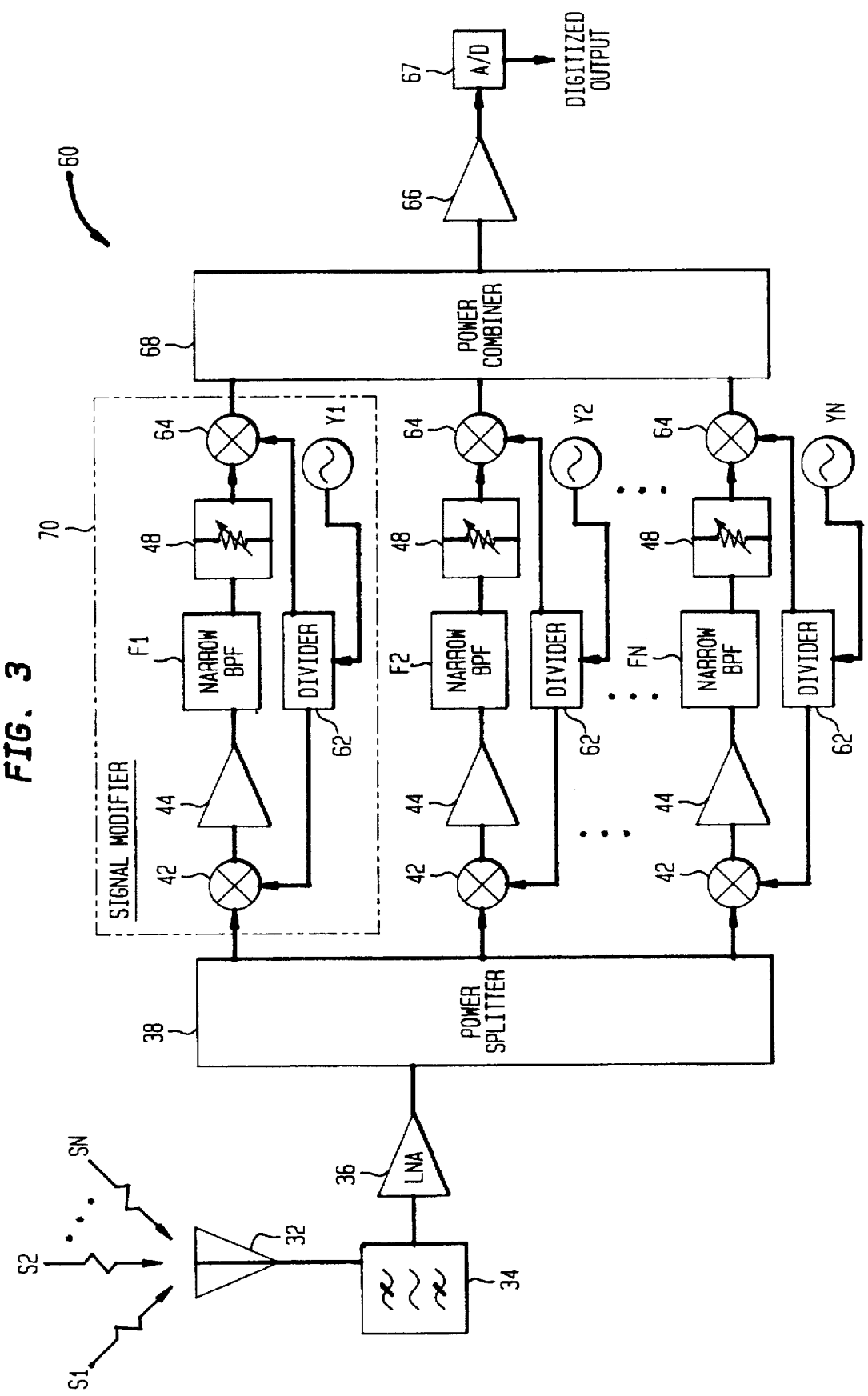

With reference now to FIG. 3, another receiving system 60 in accordance with the present invention is shown. The receiving system 60 differs from the system 30 of FIG. 2 in that the signal modifiers 40 are replaced with signal modifiers 70, which are used in conjunction with a higher frequency power combiner 68, amplifier 66 and A/D converter 67. The signal modifier 70 differs from the aforementioned signal modifier 40 by the addition of a power divider 62 and an up-converting mixer 64. The local oscillating signal of each synthesizer Y1 to YN is split by the divider 62 and applied to both the down-converting mixer 42 and to the up-converting mixer 64. The mixer 64 up-converts the filtered, level controlled IF output of the AGC circuit 48 back to the original RF frequencies of the corresponding channel of the multi-carrier signal Sm (such as in the UHF band). The power combiner 68 is thus designed as a high frequency combiner, and may be the same part as is used for the power splitter 38. A UHF linear amplifier 66 is then employed to amplify the recombined, level controlled signal. Likewise, a UHF A/D converter 67 is operable to digitize the amplified, UHF multicarrier signal.

Figure 4:
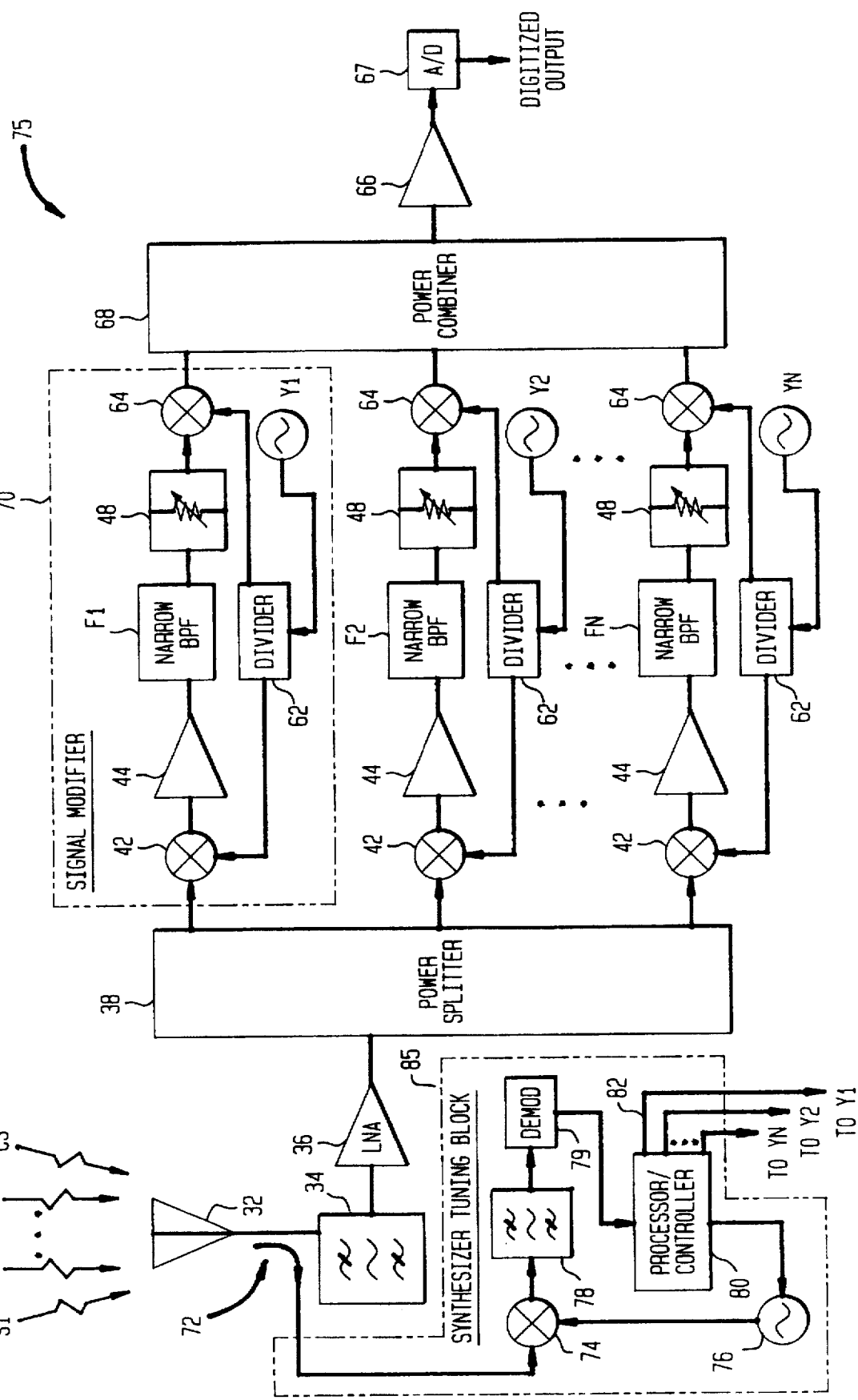

Referring to FIG. 4, yet another receiving system 75 in accordance with the present invention is shown. Receiving system 75 is essentially the receiving system 60 of FIG. 3 with the addition of a synthesizer tuning block 85. The tuning block 85 functions to provide control signals to each of the synthesizers Y1 to YN to control the local oscillating frequency of each synthesizer. Accordingly, if the frequency allocation of the S1 to SN signals change, either collectively or individually, the synthesizers Y1 to YN can be automatically returned to compensate for those changes. This allows the narrow bandpass filters F1 to FN to remain fixed and to thereby provide the same filtered IF carrier frequencies as was described previously, notwithstanding the changes in the S1 to SN signal frequencies.

Operation of the tuning block 85 is predicated upon the reception by the antenna 32 of a control signal Cs which originates from each user during a communications session, prior to or during the transmission of one of the associated S1 to SN signals. The Cs signal is transmitted in a control channel occupying a specific frequency band which may or may not lie within the band encompassed by S1 to SN. The signal Cs contains information about which frequency the associated S1 to SN signal is to be tuned to. For instance, in mobile telephone or mobile data communications applications, many users may be attempting to communicate with a base station at once, overloading system capacity for a given frequency channel. Communication can then be attempted at different frequencies, with the control channel carrying the information as to which frequency should be attempted for each user.

The tuning block 85 includes a directional coupler 72 for coupling a sample of the multi-carrier signal provided by the antenna 32, which includes the control channel signal Cs. The coupled sample is mixed down to an IF frequency by means of a mixer 74 which receives a local oscillating signal from a tunable frequency synthesizer 76. Tuning of the synthesizer 76 L.O. frequency is controlled via another control signal from a processor/controller 80. With a bandpass filter 78 having a passband corresponding to the down-converted control channel frequency range, only the control channel information is passed to a demodulator 79. The demodulated output is supplied to the processor/controller 80 which then produces a synthesizer control signal on each one of N output lines 82. Each output line 82 connects to a corresponding one of the synthesizers Y1 to YN, to thereby control the synthesized frequency thereof in accordance with the information in the control channel.

Thus disclosed are various embodiments of a multi-carrier signal processor of the present invention, particularly useful in a wireless communications receiving system. A key advantage of the invention is that it modifies the power of each modulated carrier of a multi-carrier signal to within a predetermined power level range, thereby affording the use of a limited dynamic range device such as a single A/D converter for subsequent signal processing.

It will be understood that the embodiments described herein are merely exemplary and that one skilled in the art can make many modifications and variations to the disclosed embodiments without departing from the spirit and scope of the invention. For instance, while the embodiments disclosed hereinabove have been described in reference to wireless communications, the invention may also be useful in television and radar applications. All such variations and modifications are intended to be included within the scope of the invention as defined by the appended claims.

What is claimed is:

1. An apparatus for processing a multi-carrier input signals, comprising:
   a power splitter connected to receive said input signal, for splitting said input signal into a plurality of electrical paths;
   a plurality of signal modifiers, with each one of said signal modifiers connected in one of said electrical paths and operable to isolate down-converted signal energy associated with a given carrier of said multi-carrier signal and to control said signal energy to within a predetermined power level range, wherein a plurality of signal modifier output signals are provided; and
   a power combiner for combining said signal modifier output signals to provide a multi-carrier output signal with each carrier of said multi-carrier output signal being within a predefined power level range;
   wherein each said signal modifier includes:
      a tunable frequency synthesizer for providing a local oscillating (L.O) signal at a tunable frequency;
      a down-converting mixer for mixing said multi-carrier input signal with said local oscillating signal to provide a multi-carrier intermediate frequency (IF) signal having a signal bandwidth at a translated frequency range of said given carrier;
      a bandpass filter for passing a predetermined band of IF signal energy within said translated frequency range to provide a filtered IF signal; and
      an automatic gain control (AGC) circuit coupled between said bandpass filter and said power combiner, for controlling the power level of said filtered IF signal to within said predetermined power level range to provide a level controlled IF output signal.

2. The apparatus according to claim 1, wherein each said signal modifier further includes an IF amplifier coupled between said down-converting mixer and said bandpass filter for amplifying said IF signal.

3. The apparatus according to claim 1, wherein said signal modifier output signal comprises the level controlled IF output signal of said AGC circuit.

4. The apparatus according to claim 1, further comprising:

a power divider having an input port connected to receive said L.O. signal of said tunable frequency synthesizer, said power divider splitting said L.O. signal between first and second output ports, with said first output port coupled to said down-converting mixer;

an up-converting mixer having a first input coupled to said second output port of said power divider, and having a second input connected to receive said level controlled IF output signal from said AGC circuit;

said up-converting mixer operable to mix said L.O. signal with said IF output of said AGC circuit to produce said signal modifier output signal;

whereby said signal modifier output signal occupies the same frequency range as said given carrier of said multi-carrier input signal.

5. The apparatus according to claim 4, wherein said frequency range is within the UHF frequency band.

6. The apparatus according to claim 1, wherein said narrowband filters of said plurality of signal modifiers each have an associated resonant frequency within a predefined frequency range, thereby defining a plurality of resonant frequencies within said predefined frequency range, said narrowband filters thereby providing a plurality of filtered IF signals, and wherein said resonant frequencies are uniformly spaced from one another.

7. The apparatus according to claim 6, wherein, said carriers of said multi-carrier input signal are non-uniformly spaced in frequency with respect to one another;

at least some of said synthesizers are tuned to different frequencies to thereby provide said plurality of filtered IF signals uniformly spaced in frequency with respect to one another.

8. The apparatus according to claim 1, further including in combination therewith:

an output amplifier for amplifying said multi-carrier output signal to provide an amplified multi-carrier output signal; and an analog to digital (A/D) converter for digitizing said amplified multi-carrier output signal.

9. A method for processing a multi-carrier input signal, comprising the steps of:

splitting said multi-carrier input signal into a plurality of electrical paths;

down-converting said multi-carrier input signal in each said electrical path by mixing said multi-carrier input signal in each said path with a local oscillating signal from an independently tunable frequency synthesizer, to thereby produce a multi-carrier intermediate frequency (IF) signal in each said path;

filtering the multi-carrier IF signal in each said path to isolate in each path a predetermined IF carrier thereof;

controlling power level of each said predetermined IF carrier in each said path to within a predefined power level range, wherein a plurality of equalized carriers are produced;

combining signal energy associated with said plurality of equalized carriers to form a multi-carrier output signal; and, automatically controlling the frequency of each said local oscillating signal in accordance with a control channel signal containing information indicative of carrier frequencies of said multi-carrier input signal.

10. The method according to claim 9, further including the step of up-converting each of said plurality of equalized carriers prior to said equalized carriers being combined in said combining step.

11. The method according to claim 9, wherein each carrier of said multi-carrier input signal comprises a modulated RF carrier of a specific wireless communications frequency channel.

12. A receiving system for use in a wireless communications system, comprising:

an antenna for receiving a plurality of modulated radio frequency (RF) signals each having a signal bandwidth occupying a specific frequency channel, said antenna combining said plurality of signals to form a multi-carrier input signal;

a power splitter connected to receive said multi-carrier input signal, for splitting said input signal into a plurality of electrical paths;

a plurality of signal modifiers, with each one of said signal modifiers connected in one of said electrical paths and operable to isolate signal energy associated with a given one of said modulated RF signals and to control said isolated signal energy to within a predetermined power level range, wherein a plurality of equalized signal modifier output signals are provided;

a power combiner for combining said plurality of signal modifier output signals to provide a multi-carrier output signal with each carrier of said multi-carrier output signal being within a predefined power level range; and an analog to digital (A/D) converter for digitizing said multi-carrier output signal;

wherein said antenna also receives a control signal in a control channel containing information indicative of frequency channel association with said RF signals, and wherein said receiving system further includes:

a plurality of tunable frequency synthesizers, with each said frequency synthesizer within one of said signal modifiers and providing a local oscillating signal of a tunable frequency to mix with said multi-carrier input signal within said signal modifier, thereby providing a multi-carrier intermediate frequency (IF) signal;

a synthesizer tuning block coupled to each said tunable frequency synthesizer and connected to receive said control signal, for independently controlling the frequencies of said local oscillating signals in accordance with the information in said control signal.

13. The receiving system according to claim 12, wherein said synthesizer tuning block includes:

a directional coupler for coupling said multi-carrier input signal into a coupled path;

a bandpass filter in said coupled path for passing signal energy associated substantially with said control channel;

a demodulator coupled to said bandpass filter for demodulating said signal energy associated with said control channel to provide a demodulated control signal; and a processor/controller connected to receive said demodulated control signal, for providing a plurality of synthesizer control signals in accordance with said demodulated control signal, with ones of said plurality of synthesizer control signals being provided to associated ones of said frequency synthesizers to control the frequencies of said local oscillating signals produced therein.

14. The receiving system according to claim 12, further comprising:

a bandpass filter coupled to said antenna, for filtering out frequencies outside a passband associated with said plurality of RF modulated signals;

a low noise amplifier coupled between said bandpass filter and said power splitter; and an amplifier coupled between said combiner and said A/D converter.

* * * * *